United States Patent
Baloglu

(10) Patent No.: US 8,940,587 B1
(45) Date of Patent: Jan. 27, 2015

(54) DIE SEAL DESIGN AND METHOD AND APPARATUS FOR INTEGRATED CIRCUIT PRODUCTION

(75) Inventor: Bora Baloglu, Chandler, AZ (US)

(73) Assignee: Amkor Technology, Inc., Chandler, AZ (US)

(*) Notice: Subject to any disclaimer, the term of this patent is extended or adjusted under 35 U.S.C. 154(b) by 62 days.

(21) Appl. No.: 13/546,870

(22) Filed: Jul. 11, 2012

(51) Int. Cl.
H01L 21/00 (2006.01)

(52) U.S. Cl.
USPC .................................. 438/127; 257/E23.124

(58) Field of Classification Search
USPC ................. 257/790–791, E23.116, E23.129; 438/25–26, 124, 127
See application file for complete search history.

(56) References Cited

U.S. PATENT DOCUMENTS

| | | |
|---|---|---|
| 5,450,283 A | 9/1995 | Lin et al. |
| 5,510,956 A | 4/1996 | Suzuki |
| 5,969,947 A | 10/1999 | Johnson et al. |
| 6,940,182 B2 | 9/2005 | Hilton et al. |
| 7,504,736 B2 | 3/2009 | Kim et al. |
| 7,898,093 B1* | 3/2011 | Darveaux et al. ............. 257/787 |
| 2002/0017738 A1 | 2/2002 | Miyajima |
| 2003/0168749 A1 | 9/2003 | Koike |
| 2004/0140554 A1* | 7/2004 | Kataria et al. ................. 257/706 |
| 2004/0262776 A1 | 12/2004 | Lebonheur et al. |
| 2005/0156311 A1 | 7/2005 | Hashimoto |
| 2005/0285258 A1 | 12/2005 | Chen et al. |
| 2006/0084203 A1* | 4/2006 | Gai .............................. 438/124 |
| 2011/0287587 A1 | 11/2011 | Hung et al. |
| 2011/0315956 A1* | 12/2011 | Tischler et al. ................. 257/13 |

* cited by examiner

*Primary Examiner* — William F Kraig
*Assistant Examiner* — Khaja Ahmad
(74) *Attorney, Agent, or Firm* — McAndrews, Held & Malloy, Ltd.

(57) ABSTRACT

Novel die seals control contact of a mold material with the surfaces of a semiconductor die during encapsulation, reducing stresses due to a mismatch of the coefficient of thermal expansion of the encapsulant and the semiconductor die, thereby reducing cracking of the semiconductor die, resulting in increased yields and lower costs.

23 Claims, 17 Drawing Sheets

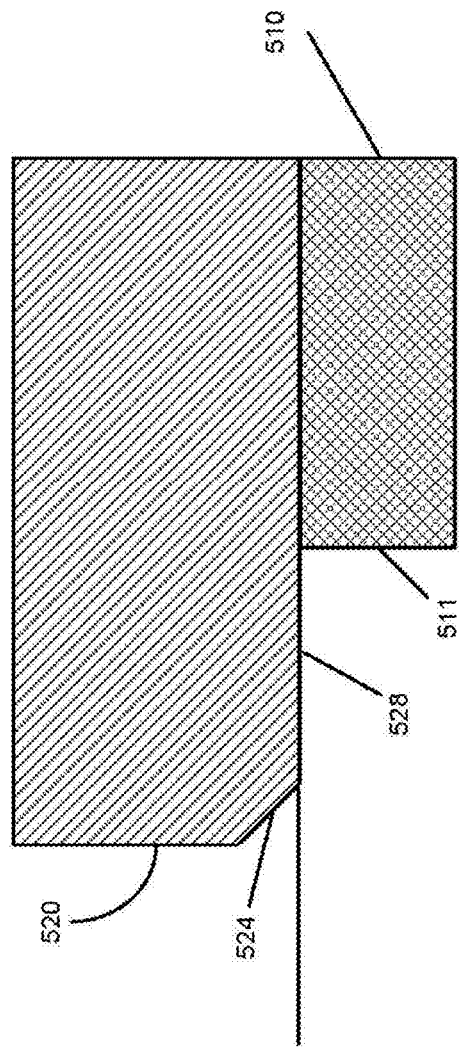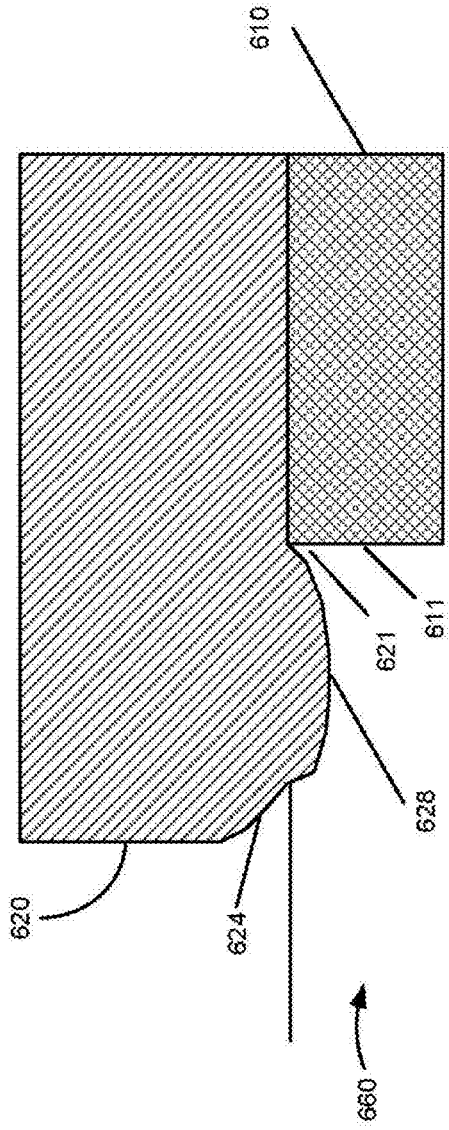
FIG. 5
FIG. 6

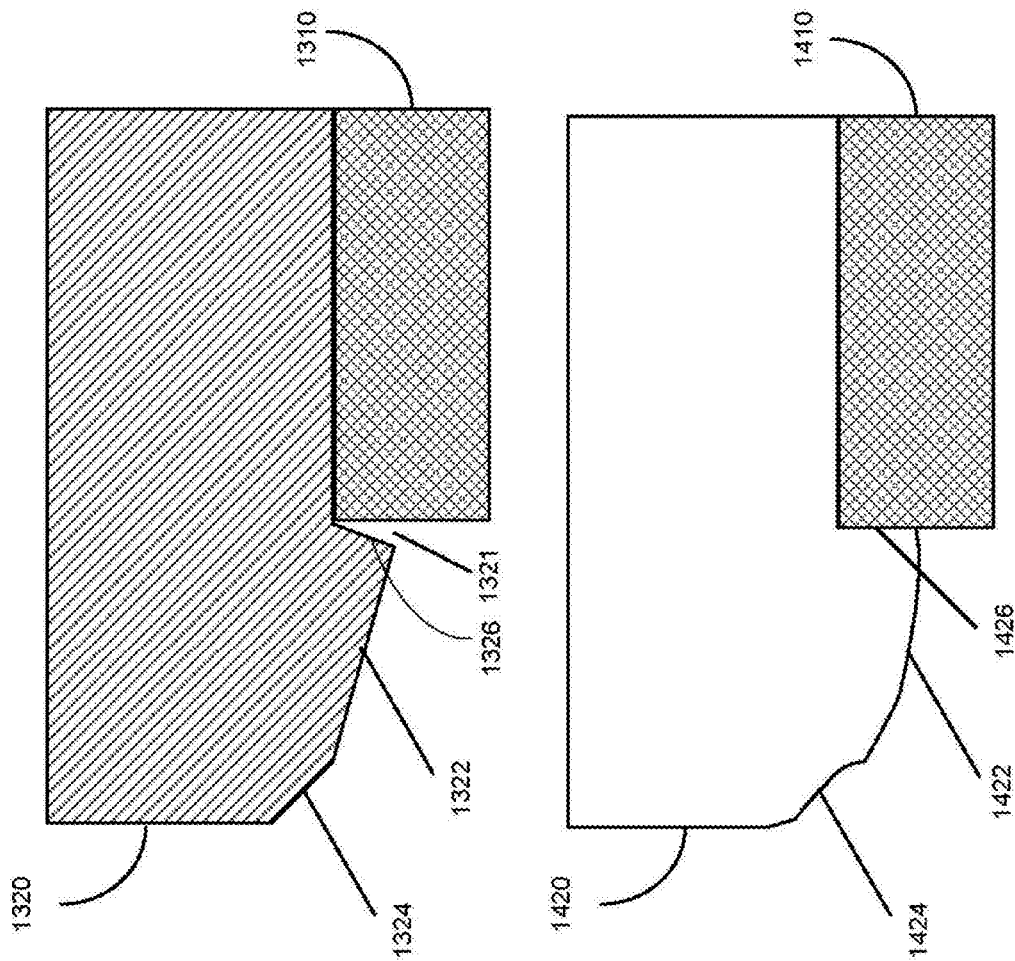

DIE SEAL DESIGN AND METHOD AND APPARATUS FOR INTEGRATED CIRCUIT PRODUCTION

CROSS-REFERENCE TO RELATED APPLICATIONS/INCORPORATION BY REFERENCE

N/A

FIELD OF THE INVENTION

The present invention, for example, relates to a die seal used to protect die surfaces from contact with molding compound during packaging of an integrated circuit.

BACKGROUND OF THE INVENTION

A die seal is a layer of flexible material pressed against the upper surface of an integrated circuit die prior to encapsulation of the die in a molding compound. The die seal is removed from contact with the die after injection of the molding compound into a mold tool is complete. The die seal restricts the flow of the molding compound during encapsulation in order to block flow of the mold material onto particular portions of the die surface.

Further limitations and disadvantages of conventional and traditional approaches will become apparent to one of skill in the art, through comparison of such systems with some aspects of the present invention as set forth in the remainder of the present application with reference to the drawings.

BRIEF DESCRIPTION OF SEVERAL VIEWS OF THE DRAWINGS

FIG. 5 shows an enlarged cross-section view of a die seal in contact with a semiconductor die, prior to application of the downward pressure upon the die seal during the process of encapsulating the die.

FIG. 6 shows an enlarged cross-section view of a die seal in contact with a corresponding semiconductor die that may correspond, for example, to the die seal and semiconductor die of FIG. 5, respectively, following application of the downward pressure used to press the die seal into contact with the semiconductor die to prevent leakage of mold material onto the upper surface of the semiconductor die, as has been calculated by the applicant using a finite element model (FEM).

FIG. 13 shows an enlarged cross-section view of a die seal in contact with a corresponding semiconductor die that may correspond, for example, to the die seal and semiconductor die of FIGS. 11 and 12, respectively, prior to application of downward pressure upon the die seal during the process of encapsulating the semiconductor die, in accordance with a representative embodiment of the present invention.

FIG. 14 is an enlarged cross-section view of a die seal in contact with a corresponding semiconductor die that may correspond to, for example, the die seal and semiconductor die of FIG. 13, in accordance with a representative embodiment of the present invention.

DETAILED DESCRIPTION OF THE INVENTION

Figure 1:
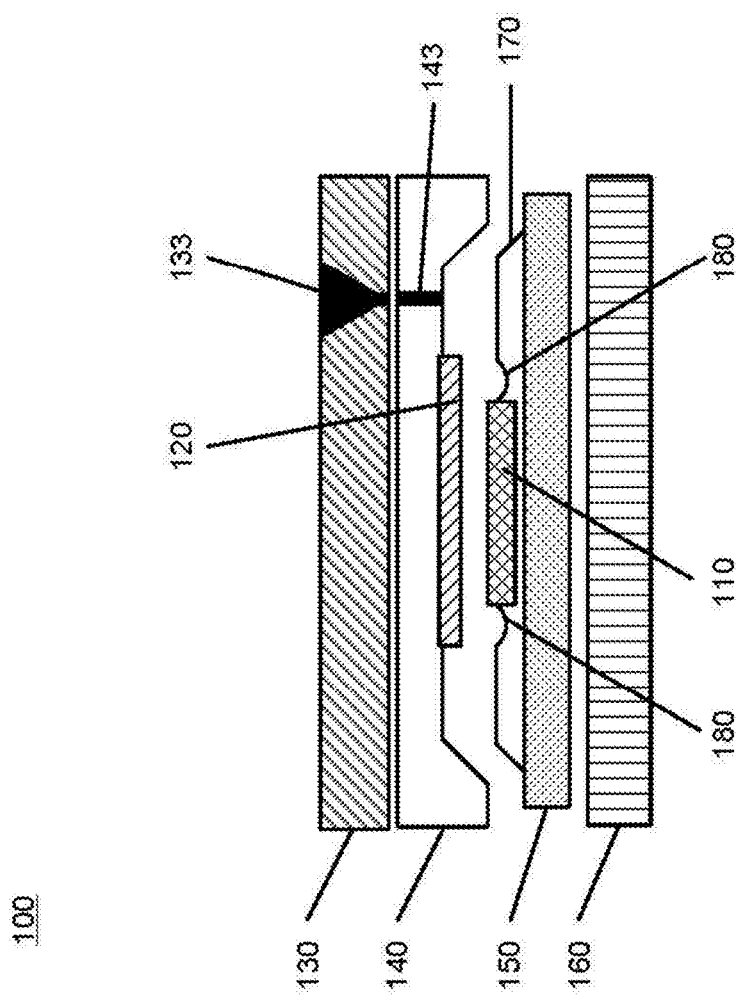
FIG. 1 is a schematic view of an exemplary mold tool, having a flexible flat die seal used to protect the upper surface of an exposed die during the encapsulation step of packaging.

Aspects of the present invention relate to die seals used to protect a surface of a semiconductor die from mold material used to encapsulate the die during packaging of integrated circuit devices. More specifically, representative embodiments of the present invention relate to certain die seal arrangements that reduce thermal stress-induced die cracking in encapsulated semiconductor devices.

Semiconductor die are encapsulated in mold material, which may also be referred to herein as mold compound, for a variety of reasons, for example, to protect die connections, to protect the die from general mechanical forces, to provide a base for electrical connection fanout, to provide a base for mounting a heat sink, to control warpage of the semiconductor die and/or overall integrated circuit package, etc. A difference in the thermal coefficient of expansion of the semiconductor die and the mold material creates stresses in the semiconductor die, leading to cracking of the semiconductor die, reducing yields and raising production costs.

Representative embodiments of the present invention relate to crack-related reliability issues in what are referred to herein as FCmBGA (Flip-Chip molded Ball Grid Array) packages. One representative embodiment of the present invention may be seen in a "cap" type die seal design that protects the top surface of the semiconductor die as well as portions of the side faces, by covering the semiconductor die similar to a hat without a brim. This unique structure allows the connection between the semiconductor die and the mold material to increase gradually from the middle of the side die face towards the corners of the semiconductor die, for example allowing warpage of the die and/or overall package to be controlled. The stresses at the side faces of the semiconductor die, where the side face connects with the mold material, are greatly reduced through the use of a representative embodiment of the present invention.

Currently, an approach referred to herein as "undercut (UC)" is being explored as a means to control/reduce stresses that appear at the "die to mold" surface. Undercut is a side effect of the use, during encapsulation, of a flat die seal that is larger than the surface of the semiconductor die surface onto which the die seal is compressed in an effort to ensure a mold free top surface of the semiconductor die. When a flat die seal is pressed against the top surface of the semiconductor die, any portion of the die seal that extends beyond the edges of the top surface of the semiconductor die tends to bulge in the direction of the force placed upon the die seal, creating a semi-circular convex shape. As the mold material flows into the tool used to encapsulate the semiconductor die, the convex shape of the bulging die seal extension, which partially defines the shape of the interior of the mold tool, causes the mold material to take on a concave semi-circular shape along the sides of the semiconductor die. Analysis has shown that high stresses appear in the middle of the semiconductor die, which is where cracks in the semiconductor die initiate.

It is understood that as the UC width gets narrower and UC depth gets deeper, reduction in the stress upon the semiconductor die can be accomplished. There are, however, limitations to how narrow and how deep the UC can be, to ensure the mold free surface of the die. Moreover, the reduction in the stress may be limited due to the difficulty in producing a narrow and deep undercut with using a flat seal design.

A representative embodiment of the present invention offers a solution to the die cracking problem that is a local structural solution, and that introduces no other affects upon the specifications for the semiconductor die package. A representative embodiment of the present invention may be used without adjustments to other aspects of the equipment used in packaging semiconductor die, making the use of this die seal design easy to adopt, in that such a die seal can be resized and structured for any given die configuration.

FIG. 1 is a schematic view of an exemplary mold tool 100, having a flexible flat die seal 120 used to protect the upper surface of an exposed die 110 during the encapsulation step of packaging. As illustrated in FIG. 1, the mold tool 100 comprises an upper chase 130, a middle plate 140 (also referred to herein as the middle layer 140 and/or the middle chase 140) to which the die seal 120 is mounted, and a lower chase 160. The semiconductor die 110 is shown mounted to a substrate 150, which is resting on the lower chase 160. During the operation of packaging, downward pressure on the upper chase 130 causes the middle plate 140 to bear down upon the substrate 150, clamping the substrate against the lower chase and closing the mold tool 100. The downward movement causes flexible die seal 120 to press down upon the semiconductor die 110, protecting the upper surface of the semiconductor die 110 from the mold material used as an encapsulant, which enters the cavity of the mold tool 100 during encapsulation via molding gate elements 133/143 in the upper chase 130 and the middle layer 140, respectively.

The pressure of the middle plate 140 upon the flexible material of the die seal 120 deforms the portions of the die seal 120 that extend beyond the upper surface of the semiconductor die 110, forming a downward bulge at each edge of the semiconductor die 110, which results in a groove 180 in the mold material 170 that abuts each side face of the semiconductor die 110. The mold material 170 is shaped by the boundaries formed by the side faces of the semiconductor die 110, the die seal 120, the middle plate 140, and the substrate 150. After an appropriate amount of time (e.g., enough time for an initial curing step), pressure upon the upper chase 130 is removed, the upper chase 130 and middle chase are moved away from the substrate 150 and the lower chase 160, and the substrate 150 with the semiconductor die 110 encapsulated in mold material 170 is then removed from the mold tool 100. The process may then be repeated.

It should be noted that although FIG. 1 shows a single mold tool 100, the elements of the mold tool 100 described above may be part of a larger apparatus having multiple cavities each with respective upper chase, middle layer, and lower chase elements, acting to encapsulate multiple die/substrate assemblies in a single operation, without departing from the spirit or scope of the present invention. Also for example, the elements of the mold tool 100 may be part of a larger apparatus having a single cavity into which a plurality of die are molded as a single system-in-package, for example each die having a respective die seal disposed in the mold tool 100. Additionally for example, the elements of the mold tool 100 may be part of a larger apparatus having a single cavity into which a plurality of independent die are molded in a mass-molding (or gang-molding) fashion and later singulated into single packages. In such multi-die configurations, such molding may for example be performed using a single continuous seal having a respective set of seal features as discussed herein for each die, or may for example be performed using a plurality of seals, one for each respective die, and each having a respective set of seal features as discussed herein.

Figure 2:
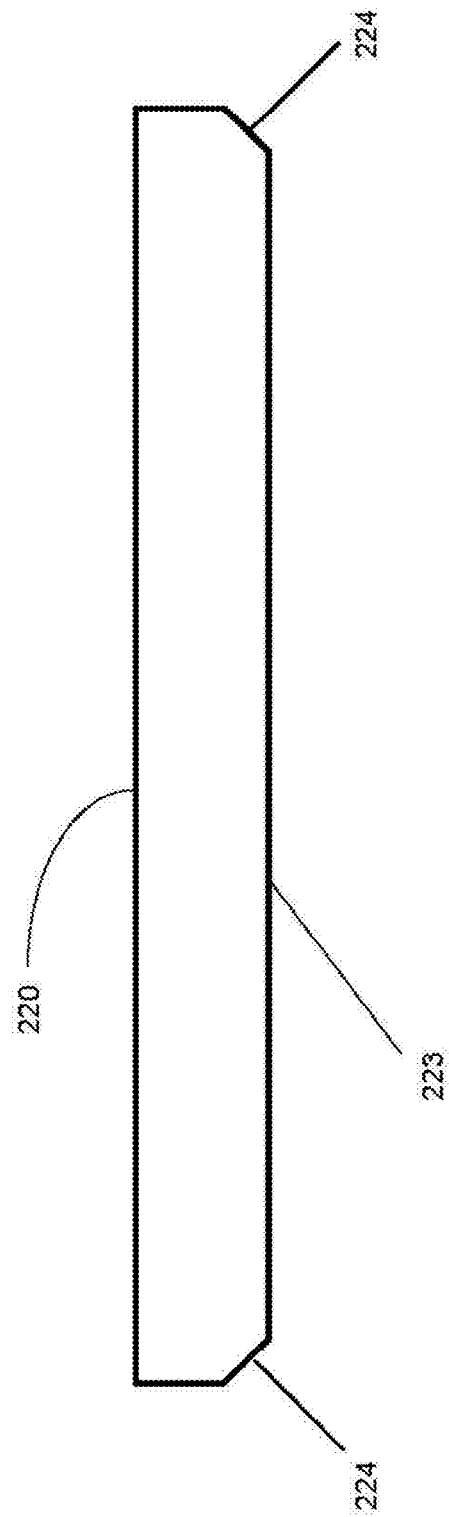
FIG. 2 is an illustration of a side view of a flat die seal that may correspond to, for example, the die seal of FIG. 1.

FIG. 2 is an illustration of a side view of a flat die seal 220 that may correspond to, for example, the die seal 120 of FIG. 1. The die seal 220 may be fabricated using, for example, a silicon rubber material such as Softec™ by ASM. The die seal 220 of FIG. 2 is shown as having a flat lower surface 223, which is used to block flow of mold material onto the upper surface of a semiconductor die, and chamfers 224, which may be used to help retain the die seal 220 in a mating recess or pocket in a mounting such as, for example, the middle plate 140 of FIG. 1, or another element of an apparatus that performs packaging function similar to that of mold tool 100 of FIG. 1. It should be noted that the chamfers 224 shown in FIG. 2 and other illustrations shown herein are for illustrative purposes only, and do not represent a specific limitation of the inventive concepts discussed herein, for example unless explicitly claimed.

Figure 3:
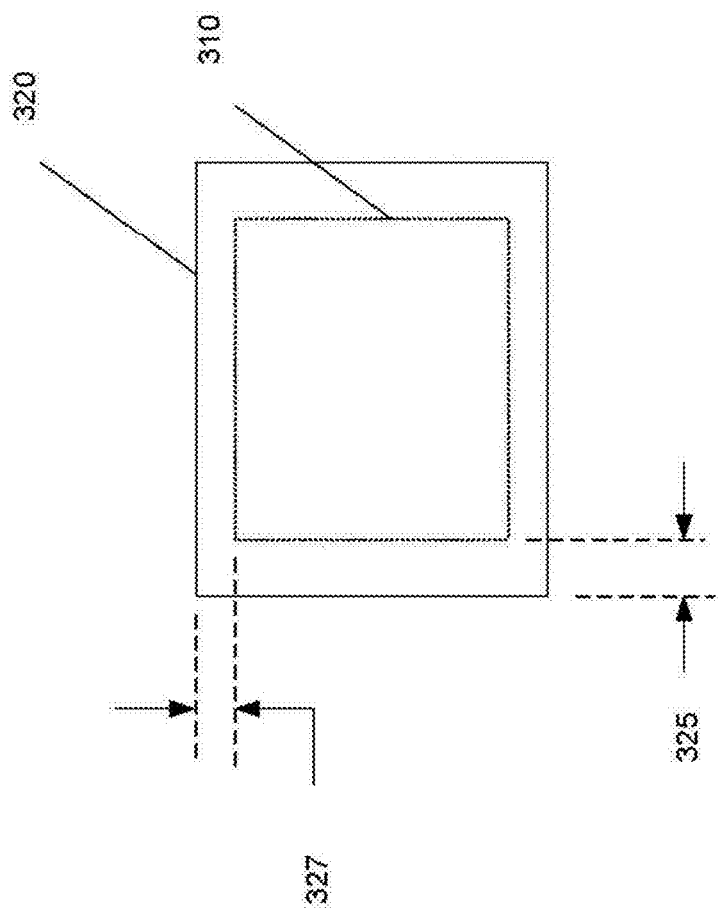
FIG. 3 is an illustration of a top view of a die seal aligned over a corresponding semiconductor die, illustrating the extension of the die seal beyond the edge of the semiconductor die, which creates an X-overhang and a Y-overhang that results in an undercut in the mold material injected during encapsulation.

FIG. 3 is an illustration of a top view of a die seal 320 aligned over an corresponding semiconductor die 310, illustrating the extension of the die seal 320 beyond the edge of the semiconductor die 310, which creates an X-overhang 325 and a Y-overhang 327 that results in an undercut in the mold material injected during encapsulation. As shown in FIG. 3, the extension of the die seal 320 beyond the edge of the semiconductor die 310 forms an X-overhang 325 and Y-overhang 327. The amount of overhang in the X and Y dimensions is a factor that determines the amount and shape of the deformation of the die seal 320 upon application of pressure upon the die seal 320 when in contact with the semiconductor die 310. In the example of FIG. 3, the size of the semiconductor die 310 may be, for example, 14 millimeters in the X-dimension and 12 millimeters in the Y-dimension, and the die seal 320 may be 21 millimeters in the X-dimension and 16 millimeters in the Y-dimension, resulting in an X-overhang 325 of 3.5 millimeters and a Y-overhang 327 of 2 millimeters.

Figure 4:
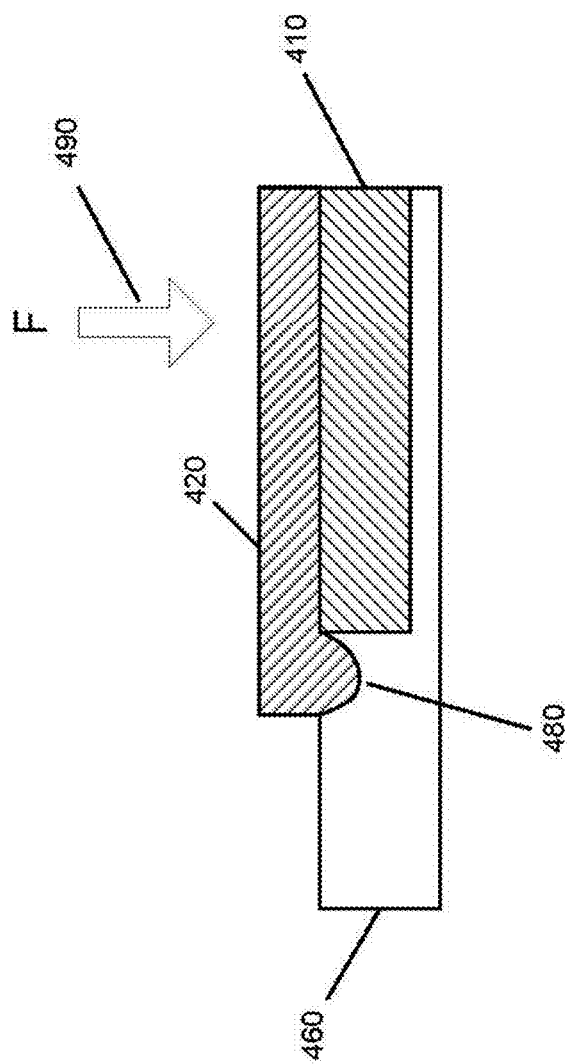
FIG. 4 is a cut-away view of a die seal compressed by a downward force F applied uniformly upon the upper surface of a semiconductor die causing deformation of the overhang of the die seal.

FIG. 4 is a cut-away view of a die seal 420 compressed by a downward force F 490 applied uniformly upon the upper surface of a semiconductor die 410 causing deformation 480 of the overhang of the die seal 420. As shown in the illustration of FIG. 4, the bulge 480 in the die seal 420 results in a corresponding groove in the mold material 460 that flows into the space surrounding the semiconductor die 410 during the encapsulation of the semiconductor die 410 within the cavity of a mold tool such as mold tool 100, for example. The groove in the mold material 460 formed by the bulge 480 thins the mold material 460 as it flows into the space between the bulge 480 in the die seal 420 and the side of the semiconductor die 410. The thinning of the mold material in the region surrounding the semiconductor die 410 reduces stresses at the mold material/die interface caused by the mismatch in the coefficient of thermal expansion (or TCE) of the mold material 460 and the die 410.

FIG. 5 shows an enlarged cross-section view of a die seal 520 in contact with a semiconductor die 510, prior to application of the downward pressure upon the die seal 520 during the process of encapsulating the die 510. The die seal 520 comprises a chamfer 524, which may be used to aid in retention of the die seal 520 within a part of a mold tool, such as the middle chase 140 of FIG. 1, described above. As shown in FIG. 5, as previously discussed, the material of the die seal 520 may be arranged to extend beyond the side of the die 510, to form an overhang 528.

FIG. 6 shows an enlarged cross-section view of a die seal 620 in contact with a corresponding semiconductor die 610 that may correspond to, for example, the die seal 520 and semiconductor die 510 of FIG. 5, respectively, following application of the downward pressure used to press the die seal 620 into contact with the semiconductor die 610 to prevent leakage of mold material onto the upper surface of the semiconductor die 610, as has been calculated by the applicant using a finite element model (FEM). As illustrated in FIG. 6, the FEM predicts that downward pressure upon the die seal 620 will result in a distortion of the flexible material of the die seal 620 affecting the chamfer 624, and producing a bulge 628 in the die seal 620. As discussed above, the bulge 628 acts to restrict the flow of mold material as it approaches the semiconductor die 610, forming a groove the runs parallel to the side of the semiconductor die 610 (in a direction perpendicular to the page of the illustration), and thinning of the mold material as it nears the upper left corner 621 of the semiconductor die 610. The thinning of the mold material results in reduced thermal stresses upon the side of the semiconductor die 610, reducing cracking of the semiconductor die 610.

A representative embodiment of the present invention may be seen in a "cap"-type die seal design, which uniquely allows the mold material to achieve its primary purposes, for example to control warpage of the semiconductor die, while significantly reducing the stresses along the sides of the semiconductor die where the semiconductor die faces the mold material. The reduction in stress provided by a representative embodiment of the present invention is accomplished by controlling contact of the semiconductor die and the mold material along the sides of the semiconductor die, which in turn cancels out the thermal stresses created by the mismatch in the coefficients of thermal expansion of the semiconductor die and the mold material. Essentially, the structure described herein of a representative embodiment of the present invention decouples the interaction between the semiconductor die and the mold material.

A die seal in accordance with some representative embodiments of the present invention includes protection of the top of the semiconductor die as well as extensions of the material of the die seal that cover the side faces of the semiconductor die. Such a die seal controls the amount and location of physical connection or contact of the mold material with the material side faces of the semiconductor die, in which the largest reduction in contact is at a point on each side face of the semiconductor die midway between corners of top surface, and in which contact of the mold material with the side faces of the semiconductor die increases from the midpoint to approximately the corners of the semiconductor die. A representative embodiment of the present invention provides the benefits of reduced warpage of the semiconductor die by sufficiently covering the corners of the semiconductor die, and in addition, resulting in a lowering of the stresses that appear in the middle of the semiconductor die. Analytical results performed by the applicant show that there is a reduction in the stress magnitude of approximately 60%, with no change observed in the warpage.

Figure 7:
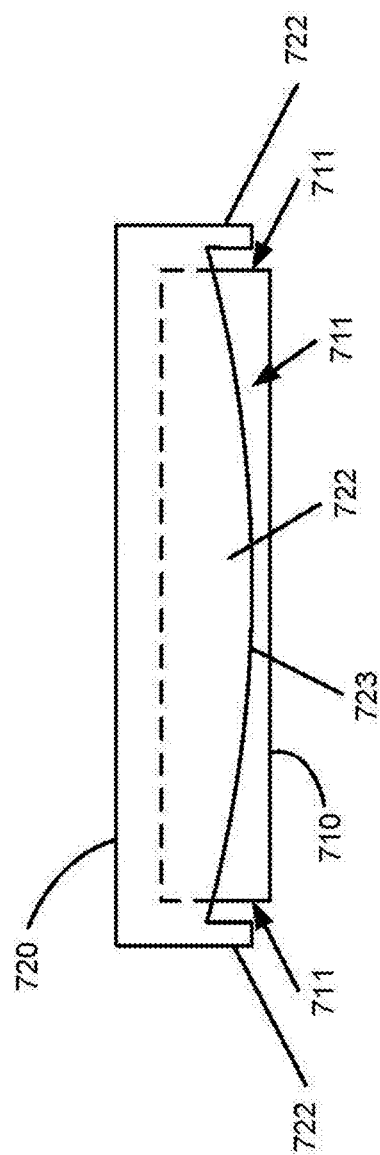
FIG. 7 shows a simplified schematic side view of an exemplary "cap-type" die seal positioned upon a corresponding semiconductor die, in accordance with a representative embodiment of the present invention.

FIG. 7 shows a simplified schematic side view of an exemplary "cap-type" die seal 720 positioned upon a corresponding semiconductor die 710, in accordance with a representative embodiment of the present invention. The illustration of FIG. 7 shows three of four flaps 722 of the die seal 720, which extend down respective sides of the die seal 720 once the die seal 720 is in place upon the semiconductor die 710. The fourth flap is not shown in the illustration of FIG. 7, and is located at the rear of the die seal 720. In accordance with a representative embodiment of the present invention, the lower edge 723 of each of the flaps 722 is designed to have a contour selected to control the amount of the side face of the semiconductor die 710 that is exposed to contact with the mold material used to encapsulate the semiconductor die 710. During encapsulation such as that described above, the deformation of the die seal 720 that occurs when downward pressure is applied to the die seal 720 causes the flaps 722 to move toward and into contact with each side face 711 of the semiconductor die 710, blocking the flow of mold material under the flaps 722 of the die seal 720, thereby controlling the amount and location of contact of the mold material with the side faces 711 of the semiconductor die, and eliminating the presence of "mold flash" on the top surface of the semiconductor die 710. By controlling contact of the mold material with the side faces of the semiconductor die 710, a representative embodiment of the present invention controls the location and magnitude of the stresses placed upon the semiconductor die 710 by the mismatch in the coefficient of thermal expansion of the semiconductor die 710 and the surrounding mold material, resulting in a reduced occurrence of cracking of the semiconductor die 710, an increase in yield, and a lower cost to manufacture. In a representative embodiment of the present invention, the depth of the extensions or "flaps" of the "cap" type seal design may be optimized for any die thickness. In addition, the exact shape of the curvature, which allows for a gradual reconnecting of the semiconductor die and the mold material in the region near the corners of the semiconductor die may also be optimized to control the stresses at that face.

Figure 8B:
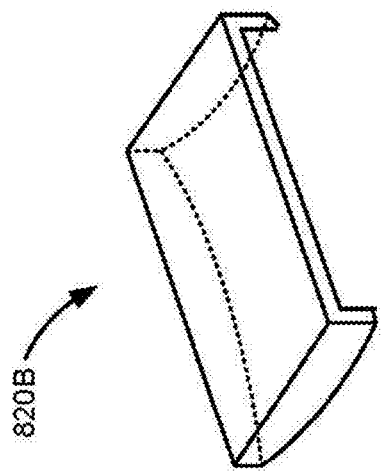
FIG. 8B shows a cut-away half schematic isometric view of a die seal that may correspond to, for example, the die seal of FIG. 8A, in accordance with a representative embodiment of the present invention.
Figure 8A:
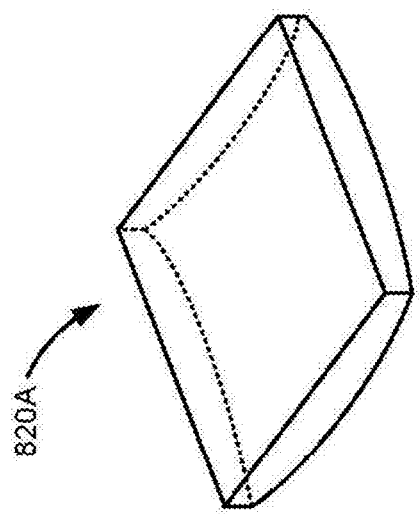
FIG. 8A shows a schematic isometric view of an exemplary die seal that may correspond to, for example, the "cap-type" die seal of FIG. 7, in accordance with a representative embodiment of the present invention.

FIG. 8A shows a schematic isometric view of an exemplary die seal 820A that may correspond to, for example, the "cap-type" die seal 720 of FIG. 7, in accordance with a representative embodiment of the present invention.

FIG. 8B shows a cut-away half schematic isometric view of a die seal 820B that may correspond to, for example, the die seal 820A of FIG. 8A, in accordance with a representative embodiment of the present invention.

Figure 9:
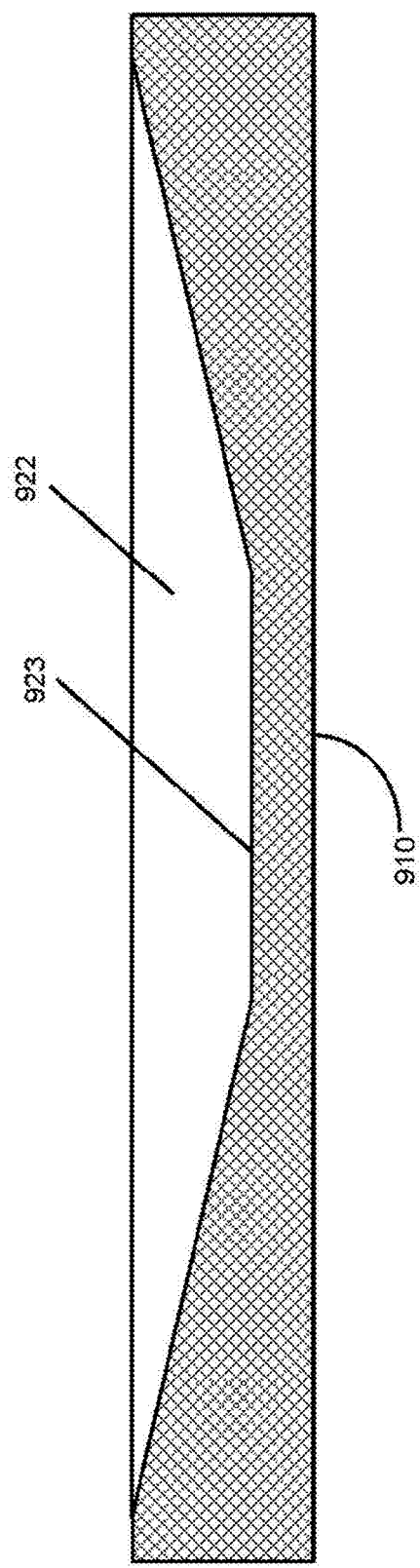
FIG. 9 illustrates a side view of the contour of an exemplary flap in relation to the side of a semiconductor die, in accordance with a representative embodiment of the present invention.

FIG. 9 illustrates a side view of the contour 923 of an exemplary flap 922 in relation to the side of a semiconductor die 910, in accordance with a representative embodiment of the present invention. In a representative embodiment of the present invention, the flap 922 may, for example, cover the side face of the semiconductor die to a depth of about 650 microns for a semiconductor die of 787 microns in thickness, at the lowest point of the flap 922 on the side face of the semiconductor die 1910. While some representative embodiments of the present invention may limit contact of mold material at the midpoint of the side face of the semiconductor die 910 to less than 50% of the thickness of the semiconductor die 910, other representative embodiments of a die seal in accordance with the present invention may limit contact of mold material at the midpoint of the side face of the semiconductor die 910 to less than 40%, 30%, 20%, or an even smaller amount of the thickness of the side face of the semiconductor die 910.

In a representative embodiments of the present invention, the flap 922 may not cover the side face of the semiconductor die 910 for a certain distance from the corner of the semiconductor die 910 such as, for example, about 1 millimeter, to maintain contact of the mold material with the corners of the semiconductor die 910, and may gradually cover the side face of the semiconductor die 910 from that point, with maximum coverage of the semiconductor die 910 at the midpoint between the corners of the semiconductor die 910. The profile of the flap 922 may, for example, be optimized for the size of the semiconductor die 910, the design of the package, and the characteristics of the mold material used to encapsulate the semiconductor die 910.

Figure 10:
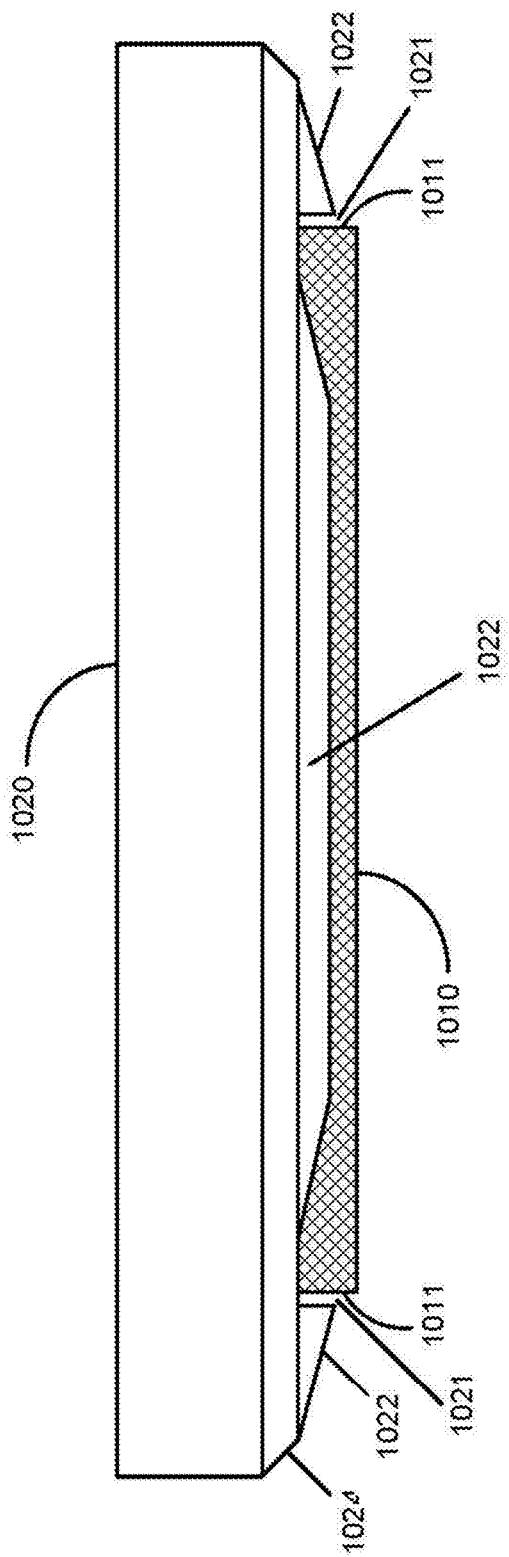
FIG. 10 is a side view of an exemplary die seal positioned in relation to a corresponding semiconductor die, in accordance with another representative embodiment of the present invention.

FIG. 10 is a side view of an exemplary die seal 1020 positioned in relation to a corresponding semiconductor die 1010, in accordance with another representative embodiment of the present invention. The illustration of FIG. 10 shows three of four flaps 1022 of the die seal 1020 when positioned over the semiconductor die 1010, but before the application of downward pressure upon the die seal 1020. As shown, the flaps 1022 are arranged to provide a clearance gap 1021 from the corresponding side of the semiconductor die 1010, to permit the placement of the die seal 1020 over the semiconductor die 1010 prior to the application of pressure upon the die seal 1020 that results in movement of the flaps 1022 into contact with the sides 1011 of the semiconductor die 1020, as previously described above.

Figure 11:
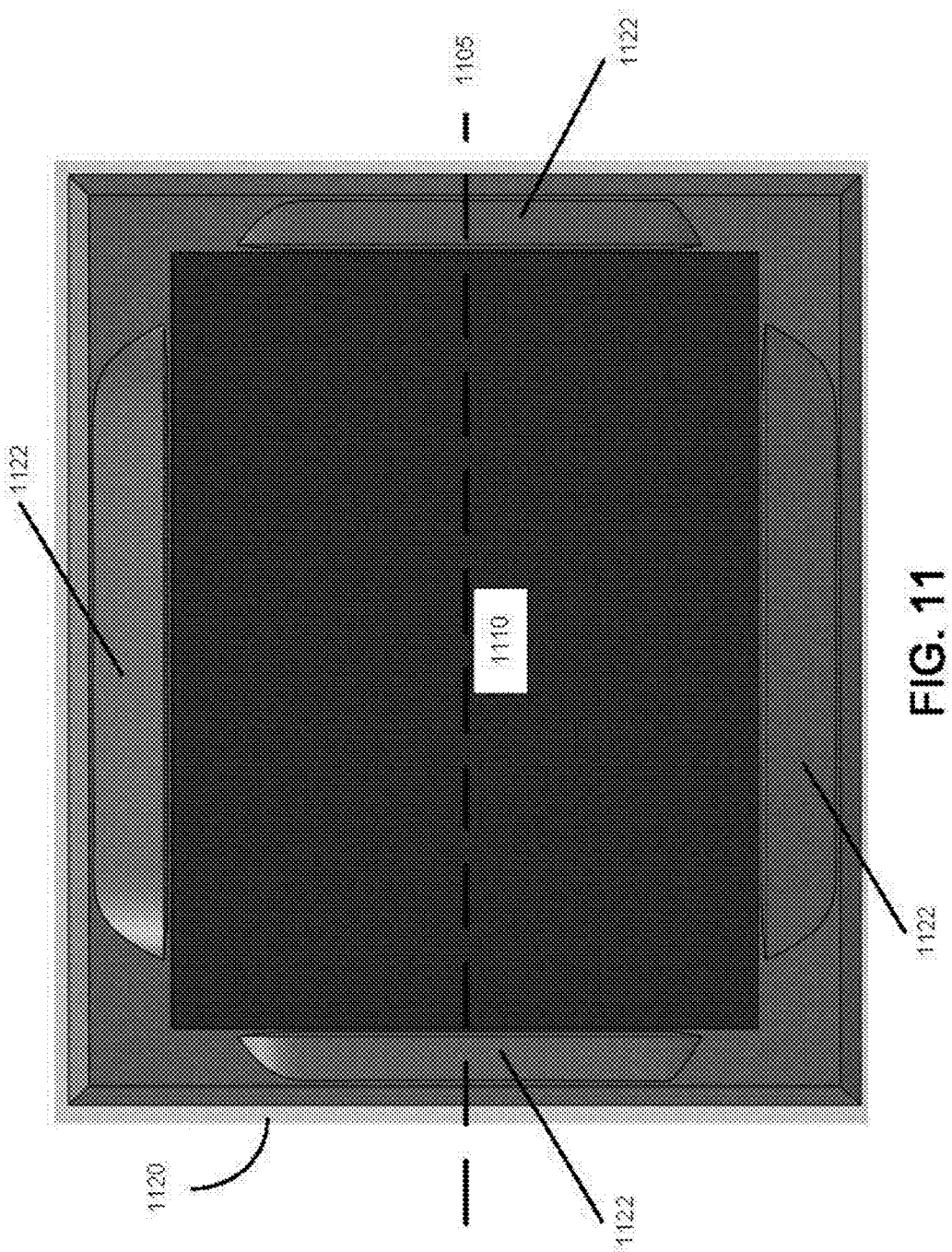
FIG. 11 shows a bottom view of an exemplary cap-type die seal in relation to a corresponding semiconductor die, in accordance with a representative embodiment of the present invention.

FIG. 11 shows a bottom view of an exemplary cap-type die seal 1120 in relation to a corresponding semiconductor die 1110, in accordance with a representative embodiment of the present invention. As shown in FIG. 11, the die seal 1120 comprises four elongated members or flaps 1122 that are positioned parallel to a corresponding side face of the semiconductor die 1110. In the illustrated embodiment of FIG. 11, the length of each flap 1122 may be somewhat less than the length of the corresponding side or face of the semiconductor die 1110. In some representative embodiments of the present invention, the contour of the surface of each of the flaps 1122 facing the semiconductor die 1110 may, for example, correspond to the contour 923 of the flap 922 of FIG. 9. FIG. 11 also illustrates a reference line 1105 that shows the location of a cross section, which is described with respect to FIG. 12, below.

Figure 12:
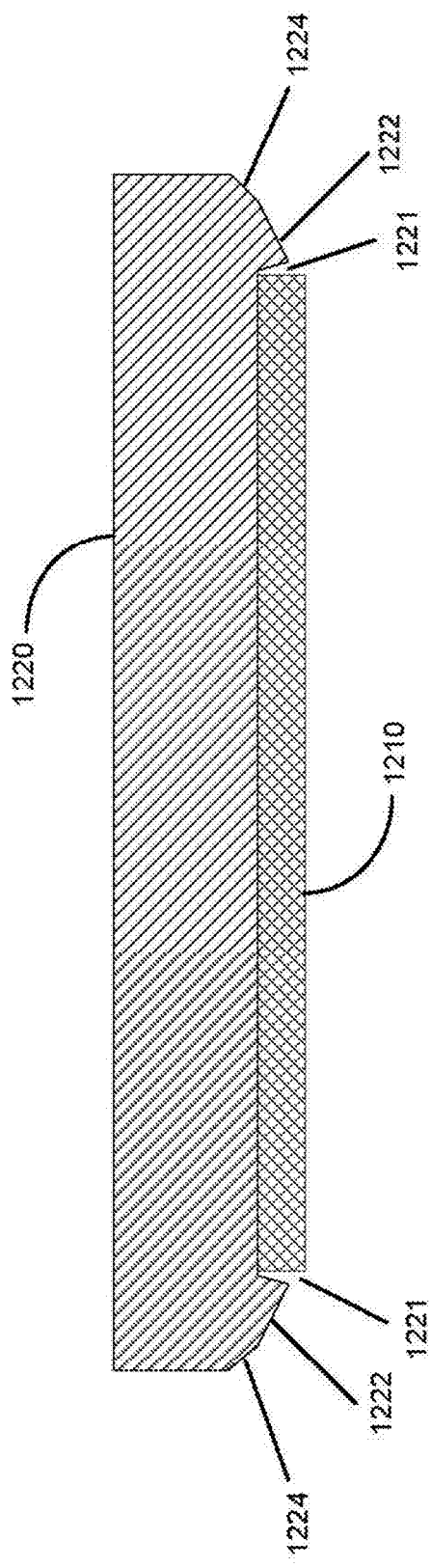
FIG. 12 is a cross section view of an exemplary die seal that may correspond, for example, to a cross section of the die seal of FIG. 11 at the reference line, in accordance with a representative embodiment of the present invention.

FIG. 12 is a cross section view of an exemplary die seal 1220 that may correspond, for example, to a cross section of the die seal 1120 of FIG. 11 at the reference line 1105, in accordance with a representative embodiment of the present invention. As can be seen in FIG. 12, an upper surface of a semiconductor die 1210 is in contact with a flat portion of the die seal 1220, and two of the four flaps 1222 face corresponding sides of semiconductor die 1210, separated by corresponding gaps 1221 that permit placement of the die seal 1220 over the semiconductor die 1210, during the downward movement of the die seal 1220 and other elements of a mold tool such as the mold tool of FIG. 1, for example. FIG. 12 also illustrates a chamfer 1224 that may be used in some representative embodiments of the present invention to help retain the die seal 1220 in the element of the mold tool to which it is mounted.

FIG. 13 shows an enlarged cross-section view of a die seal 1320 in contact with a corresponding semiconductor die 1310 that may correspond, for example, to the die seal 1120, 1220 and semiconductor die 1110, 1210 of FIGS. 11 and 12, respectively, prior to application of downward pressure upon the die seal 1320 during the process of encapsulating the semiconductor die 1310, in accordance with a representative embodiment of the present invention. The illustration of FIG.

13 also shows a flap 1322 with inner face 1326 corresponding to and generally parallel to one side face of the semiconductor die 1310. In addition, the die seal 1320 comprises a chamfer 1324, which may be used to aid in retention of the die seal 1320 within a part of a mold tool such as, for example, the middle layer 140 of FIG. 1, previously discussed above. As shown in FIG. 13, the portion of the material of the die seal 1320 extends beyond the side of the semiconductor die 1310 to form an overhang that includes the chamfer 1324 and the flap 1322.

FIG. 14 is an enlarged cross-section view of a die seal 1420 in contact with a corresponding semiconductor die 1410, that may correspond to, for example, the die seal 1320 and semiconductor die 1310 of FIG. 13, in accordance with a representative embodiment of the present invention. The illustration of FIG. 14 shows the position of flap 1422, following application of downward pressure upon the die seal 1420 to cause contact of the die seal 1420 with the semiconductor die 1410 with sufficient force to block flow of mold material onto the upper surface of the semiconductor die 1410, as predicted by an analysis performed by the applicant using a FEM. As shown in FIG. 14, the FEM predicts that the downward pressure upon the die seal 1420 will result in deformation of the flexible material of the die seal 1420, resulting in the clamping of a face 1426 of the flap 1422 against a corresponding side face of the semiconductor die 1410. A described above, the flap 1422 covers at least a portion of the side face of the semiconductor die 1410, controlling contact of the mold material with the side face of the semiconductor die 1410, and reducing stress upon the semiconductor die 1410 caused by a difference in the coefficient of thermal expansion of the mold material and the semiconductor die 1410, resulting in reduced cracking of the semiconductor die 1410.

Figure 15:
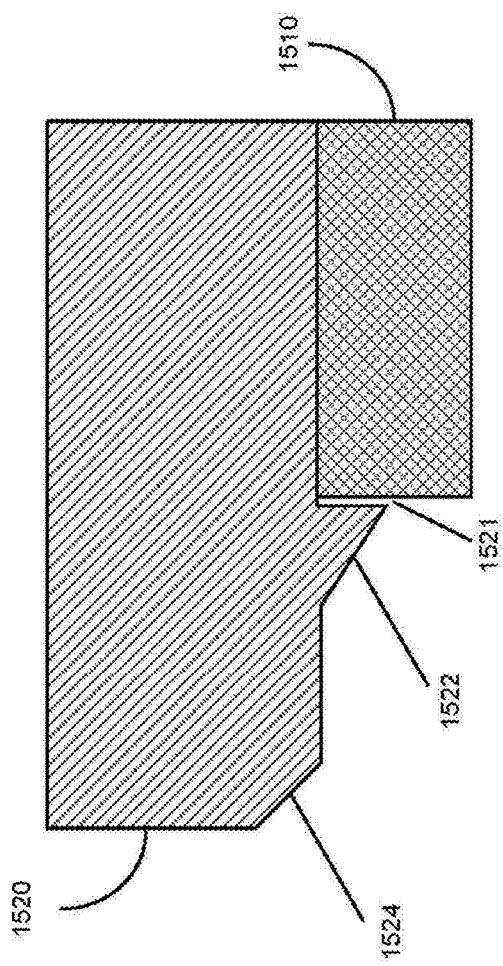
FIG. 15 shows an enlarged cross-section view of an exemplary die seal in contact with a corresponding semiconductor die that may correspond, for example, to the die seal and semiconductor die of FIGS. 11 and 12, respectively, prior to the application of downward pressure upon the die seal used in the process of encapsulating the semiconductor die, in accordance with another representative embodiment of the present invention.

FIG. 15 shows an enlarged cross-section view of an exemplary die seal 1520 in contact with a corresponding semiconductor die 1510 that may correspond, for example, to the die seal 1120, 1220 and semiconductor die 1110, 1210 of FIGS. 11 and 12, respectively, prior to the application of downward pressure upon the die seal 1520 used in the process of encapsulating the semiconductor die 1510, in accordance with another representative embodiment of the present invention. As shown in FIG. 15, a flap 1522 corresponding to a side face of the semiconductor die 1510 is separated by a gap 1521 to allow the downward placement of the die seal 1520 over the semiconductor die 1510. The die seal 1520 also comprises a chamfer 1534, which may, in some representative embodiments, be used to aid in retention of the die seal 1520 within a part of a mold tool such as, for example, the middle layer 140 of FIG. 1, previously discussed above. As shown in FIG. 15, the portion of the material of the die seal 1520 extends beyond the side of the semiconductor die 1510 to form an overhang that includes the chamfer 1524 and the flap 1522.

Figure 16:
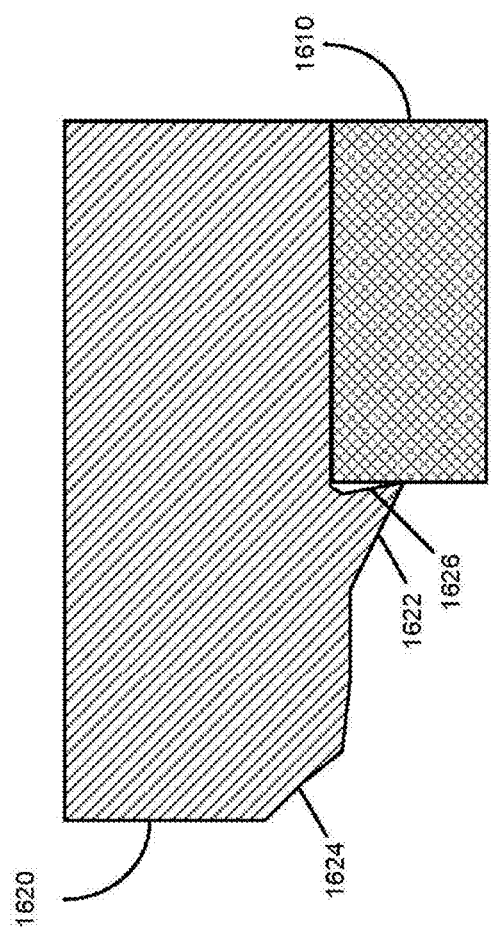
FIG. 16 is an enlarged cross-section view of a die seal in contact with a corresponding semiconductor die that may correspond to, for example, the die seal and semiconductor die of FIG. 15, in accordance with another representative embodiment of the present invention.

FIG. 16 is an enlarged cross-section view of a die seal 1620 in contact with a corresponding semiconductor die 1610, that may correspond to, for example, the die seal 1520 and semiconductor die 1510 of FIG. 15, in accordance with another representative embodiment of the present invention. The illustration of FIG. 16 shows the position of a flap 1622 that may correspond to, for example, the flap 1522 of FIG. 15, following application of sufficient downward pressure upon the upper surface of the die seal 1620 to cause deformation and contact of the die seal 1620 with the semiconductor die 1610 to limit flow of mold material (not shown) between the face 1626 of the flap 1622 and the corresponding side face of semiconductor die 1610 and onto the upper surface of the semiconductor die 1410, as predicted by analysis performed by the applicant using a FEM. As illustrated in FIG. 16, sufficient downward pressure upon the die seal 1620 causes deformation of the flexible material of the die seal 1620, causing the face 1626 of the flap 1622 to press upon the corresponding side face of the semiconductor die 1610. As described above, a flap 1622 designed in accordance with a representative embodiment of the present invention may cover at least a portion of the side face of the semiconductor die 1610 sufficiently tightly to minimize contact of the mold material with the covered area of the side face of the semiconductor die 1610, thereby reducing stresses upon the semiconductor die 1610 caused by a difference in the coefficient of thermal expansion of the mold material and the semiconductor die 1610, and the formation of cracks in the semiconductor die 1610. It should be noted that although FIG. 16 illustrates the presence of a void between the face 1626 and the corresponding side face of the semiconductor die 1610, this does not represent a specific limitation of the present invention, for example unless explicitly claimed.

Another representative embodiment of the present invention may be employed to address manufacturing difficulties encountered when trying to solve die cracking issues in, for example, Flip-Chip molded Ball Grid Array (FCmBGA) packages. The applicant has found, for example through finite element analysis and from experimental data, that a larger groove width such as, for example, a groove width of greater than about 3 millimeters, creates an improved groove geometry that handles high stresses at critical locations in a semiconductor die, and in turn eliminates the die cracking issue. The use of larger die seals that can produce larger groove widths can, however, interfere with the placement of the molding gate in the elements of a molding tool such as, for example, the middle layer 140 and upper chase 130 of a mold tool such as mold tool 100 of FIG. 1. The issue of molding gate placement is a newly introduced problem, as groove widths have in the past been designed to be narrow (e.g., less than about 3 millimeters, and sometimes in the range of about 1 millimeter to about 2 millimeters).

Some representative embodiments of the present invention use a curved die seal design that produces a curved groove geometry. This structure eliminates or minimizes many manufacturing difficulties, such as those related to molding gate placement, that are introduced by the desire for a wider groove geometry. In addition, the "oval-like" shape of the groove geometry of a representative embodiment of the present invention is a more robust geometry than that produced by a rectangular die seal, in that the curved die seal has no sharp corners. The unique structure of such a representative embodiment of the present invention addresses the manufacturing difficulties, as well as creating the desired groove width at critical locations such as, for example, those located at the middle of the side face of the semiconductor die, where the semiconductor die facing the mold material experiences levels of stresses that have been shown to cause cracking of the semiconductor die.

Figure 17:
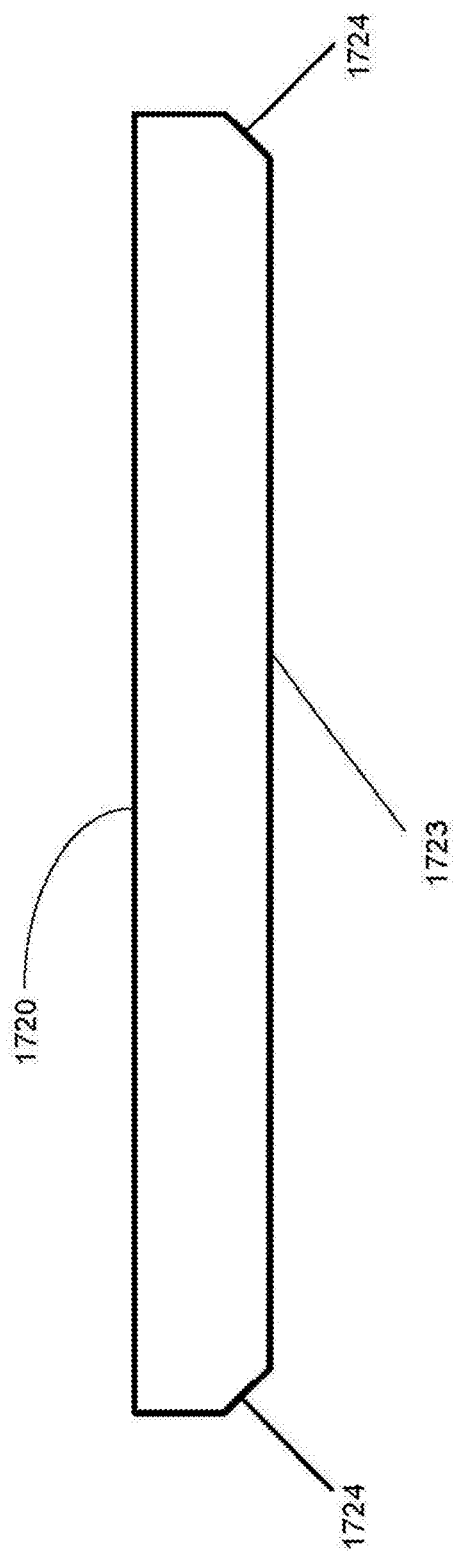
FIG. 17 is a side view of an exemplary curved die seal, in accordance with another representative embodiment of the present invention.

FIG. 17 is a side view of an exemplary curved die seal 1720, in accordance with another representative embodiment of the present invention. As with the die seal 220 of FIG. 2, the die seal 1720 may be fabricated using, for example, a silicon rubber material such as the Softec™ material, mentioned above. The die seal 1720 shown in FIG. 17, however, is illustrated as having a flat lower surface 1723, without the protrusions or flaps illustrated in the representative embodiments of FIGS. 7-16. During encapsulation of a semiconductor die, the lower surface 1723 of the die seal 1720 is placed upon the top surface of the semiconductor die with sufficient force to minimize or prevent the flow of mold material (not shown) onto the upper surface of the semiconductor die. The die seal 1720 is also shown in FIG. 17 as including chamfers 1724, which may be used to help retain the die seal 1720 within a mating recess or pocket in an element of a mold tool such as, for example, the middle plate 140 of FIG. 1, or another element of an apparatus that performs packaging function similar to that of mold tool 100 of FIG. 1. It should be noted that the chamfers 1724 shown in FIG. 17 and other illustrations shown herein are for illustrative purposes only, and do not represent a specific limitation of the inventive concepts discussed herein, for example unless explicitly claimed.

In a representative embodiment of the present invention, a structure is created by introducing a larger radius at the corners of a rectangular flat seal. Increasing the radius of curvature of the edge of the die seal nearest the point at which the die seal contacts the corner of the semiconductor die permits the creation of an "oval" shape groove geometry, where a desired amount of clearance for the molding gate is gained along with the desired groove width. The use of a representative embodiment of the present invention results in a wider groove in the molding material at the middle of each side of an encapsulated semiconductor die, and may be used to provide a groove width of 3 millimeters or more, which the applicant has found to be desirable to address reliability issues caused by cracking of semiconductor die. As previously discussed above, the middle of the side face of the semiconductor die has been found to be the point at which the stresses upon the semiconductor die caused by contact with the mold material are the greatest.

In addition to the above, the use of a representative embodiment of the present invention results in a narrower groove width at the corners of the semiconductor die, providing additional support by the mold material in that area. As also previous discussed above, securing the semiconductor die at the corners is a desirable feature, to address concerns regarding warpage. It should be noted that representative embodiments of the present invention may be employed to permit the use of existing mold tool components with minimal change for manufacturability.

Figure 18:
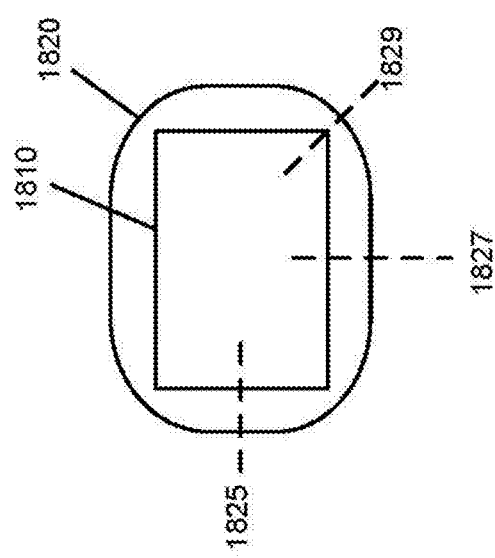
FIG. 18 shows a top view of the outline of an exemplary die seal having a curved boundary that may correspond to, for example, the die seal of FIG. 17, in relation to the outline of a corresponding semiconductor die, in accordance with a representative embodiment of the present invention.

FIG. 18 shows a top view of the outline of an exemplary die seal 1820 having a curved boundary that may correspond to, for example, the die seal 1720 of FIG. 17, in relation to the outline of a corresponding semiconductor die 1810, in accordance with a representative embodiment of the present invention. The die seal 1820 of FIG. 18 is illustrated as having a specifically selected radius of curvature in the portion proximate the corners of the semiconductor die 1810 and extension of the die seal 1820 beyond the edge of the semiconductor die 1810. As shown in FIG. 18, the die seal 1820 has a curved portion extending a distance X-overhang beyond the outline of the semiconductor die 1810 in the X-dimension, as measured at line 1825, a curved portion extending a distance Y-overhang beyond the outline of semiconductor die 1810 in the Y-dimension, as measured at line 1827, and a curved portion extending a corner overhang distance beyond the corner of the semiconductor die 1810, as measured at line 1829. The corner overhang 1829 may, for example, be measured as the distance from the point of the die seal 1820 closest to a corner of the semiconductor die 1810.

The die seal 1820 prevents flow of mold material onto the top surface of the semiconductor die 1810 upon being pressed upon the semiconductor die 1810, and in addition, deforms to cause a groove in the mold material used for encapsulation. A number of factors influence the dimensions of the groove in the mold material that results from the deformation of the die seal 1820. For example, the thickness of the die seal 1820, the radius of curvature near the corners of the semiconductor die, the amount of X-overhang 1825, Y-overhang 1827, and corner overhang, the material used to fabricate the die seal 1820, and the pressure applied to the die seal 1820 during the encapsulation process are all factors that determine the amount and shape of the deformation of the die seal 1820, and the resulting groove in the mold material surrounding the semiconductor die 1810. In a representative embodiment of the present invention, the X and Y dimensions of the semiconductor die 1810 may be, for example, approximately 19.2 millimeters and 14.5 millimeters, respectively. The amount of X-overhang and Y-overhang measured at the midpoints of the sides of the semiconductor die 1810, shown in FIG. 18 by line 1827 and 1825, may be approximately 3.5 millimeters, the corner overhang at each of the four corners of the semiconductor die 1810, represented in FIG. 18 as line 1829, may be approximately 0.8 millimeters, and the radius of curvature at the point on the die seal 1820 nearest a corner of the semiconductor die 1810 may be in the range of about 1.5 millimeters to about 12 millimeters.

Figure 19:
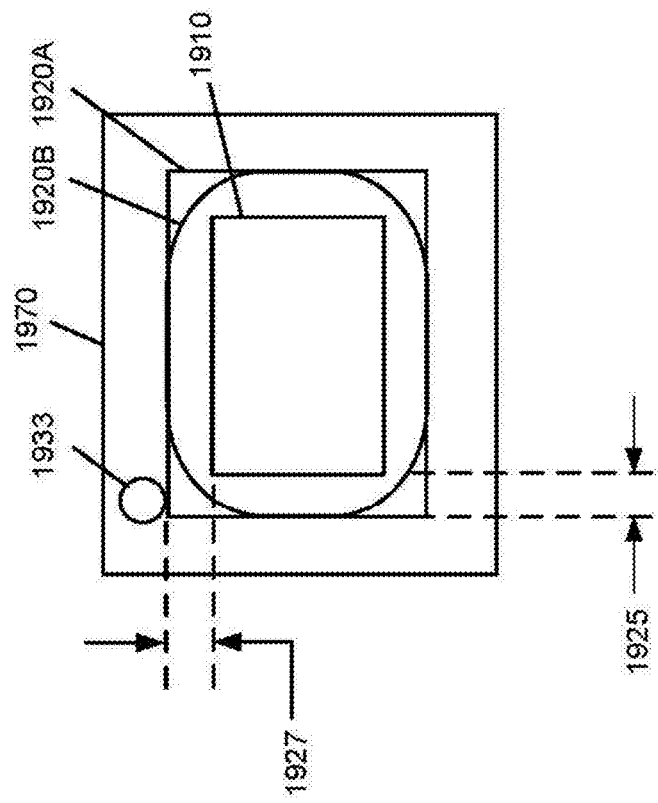
FIG. 19 illustrates a comparison of an outline of a semiconductor die, the outline of a suitable rectangular die seal having an X-overhang and a Y-overhang of 3 millimeters, and the outline of a curved die seal also having an X-overhang and Y-overhang of 3 millimeters, in accordance with a representative embodiment of the present invention.

FIG. 19 illustrates a comparison of an outline of a semiconductor die 1910, the outline of a suitable rectangular die seal 1920A having an X-overhang 1925 and a Y-overhang 1927 of 3 millimeters, and the outline of a curved die seal 1920B also having a maximum X-overhang and Y-overhang of 3 millimeters, in accordance with a representative embodiment of the present invention. The illustration of FIG. 19 also shows the relative placement of a molding gate 1930 used to inject mold material into a mold tool such as, for example, the mold tool 100 of FIG. 1, and the outline of the mold material of the resulting mold cap 1970 that surrounds the semiconductor die 1910 following encapsulation. As can be seen in FIG. 19, a curved die seal in accordance with a representative embodiment of the present invention provides greater latitude in placement of the molding gate 1933 than a rectangular die seal having the same X and Y overhang and producing the same groove width at the midpoint of the edge of the semiconductor die 1910.

With reference to FIG. 1, it should be noted that the location of the point of exit of the molding gate elements 133/143 from the upper chase 130 through the middle layer 140 into the mold cavity (i.e., formed by the middle layer 140 and the lower chase 160 of FIG. 1) is excluded from the area of the middle layer 140 covered by the die seal 120. Further, the location of the entrance of the molding gate 133 on the top surface of the upper chase 130, which may be significantly larger than the exit of molding gate element 143, is constrained to be a certain minimum distance from the edge of the upper chase 130. Those two constraints limit the location of the elements of the molding gate 133/143 to be along an edge, or at the corner of the die seal 120, illustrated in FIG. 19 as molding gate 1933, when using a rectangular die seal such as die seal 1920A of FIG. 19.

As mention above, molding gates such as that illustrated as molding gate 133 in FIG. 1, may be placed either in the center or the corner of the upper chase 130 and middle layer 140. With die seals designed to achieve narrow groove widths (e.g., in the range of about 1 to about 2 millimeters), placement of the molding gate 130 in those areas has not previously represented a significant problem. As discussed above, one solution to die reliability issues involves the use of wider grooves around the semiconductor die, preferable 3 millimeters wide or wider at the midpoint of each side of the semiconductor die, and molding gate placement therefore becomes more of an issue for manufacturability reasons, especially for larger die seals.

It can be seen in FIG. 19 that the use of a curved die seal, such as the exemplary die seal 1920B, provides additional area in the area of the corner of the semiconductor die 1910 in which the molding gate 1933 may be located, providing additional flexibility in manufacturing. The curvature of a die seal designed in accordance with a representative embodiment of the present invention may be easily optimized for the necessary clearance from the molding gate as well as the desired width of the groove at the middle of each side of the semiconductor die, which has been found to reduce cracking due to stress at the semiconductor die to mold material interface.

Figure 20:
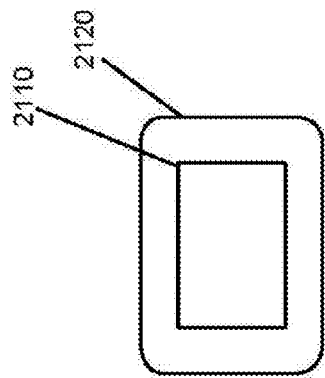
FIG. 20 illustrates the outline of an exemplary curved die seal having a radius of curvature of about 1.5 millimeters in the region of the corners of the corresponding semiconductor die, in accordance with one representative embodiment of the present invention.
Figure 21:
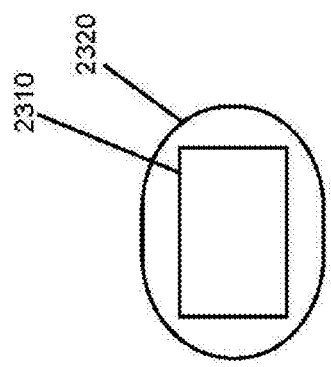
FIG. 21 illustrates the outline of an exemplary curved die seal having a radius of curvature of about 3 millimeters in the region of the corners of the corresponding semiconductor die, in accordance with another representative embodiment of the present invention.
Figure 22:
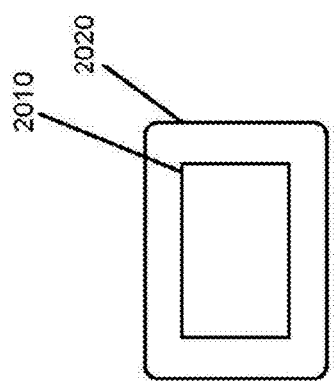
FIG. 22 illustrates the outline of an exemplary curved die seal having a radius of curvature of about 6 millimeters in the region of the corners of the corresponding semiconductor die, in accordance with yet another representative embodiment of the present invention.
Figure 23:
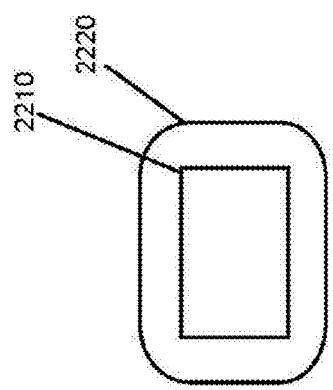
FIG. 23 illustrates the outline of an exemplary curved die seal having a radius of curvature of about 12 millimeters in the region of the corners of the corresponding semiconductor die, in accordance with still another representative embodiment of the present invention.

FIGS. 20-23 illustrate a series of exemplary curved die seals exhibiting a progressive change of the die seal shape from a more rectangular to an "oval like" shape, in accordance with various representative embodiments of the present invention. As can be seen in FIGS. 20-23, the die seals 2020, 2120, 2220, 2320 have different radii of curvature in the area of the corner of the corresponding semiconductor die. For example, FIG. 20 illustrates the outline of an exemplary curved die seal 2020 having a radius of curvature of about 1.5 millimeters in the region of the corners of the corresponding semiconductor die 2010, in accordance with one representative embodiment of the present invention. FIG. 21 illustrates the outline of an exemplary curved die seal 2120 having a radius of curvature of about 3 millimeters in the region of the corners of the corresponding semiconductor die 2110, in accordance with another representative embodiment of the present invention. FIG. 22 illustrates the outline of an exemplary curved die seal 2220 having a radius of curvature of about 6 millimeters in the region of the corners of the corresponding semiconductor die 2210, in accordance with yet another representative embodiment of the present invention. FIG. 23 illustrates the outline of an exemplary curved die seal 2320 having a radius of curvature of about 12 millimeters in the region of the corners of the corresponding semiconductor die 2310, in accordance with still another representative embodiment of the present invention. It should be noted that a representative embodiment of the present invention is not limited to the use of a radius of curvature in the specific amounts given above, and that the specific values given for the exemplary embodiments of FIGS. 20-23 do not represent a specific limitation of the present invention (e.g., unless explicitly claimed), in that other values may be used.

It should again be noted that the curved groove geometry of a representative embodiment of the present invention provides improvements in manufacturability, due to the use of a wider groove at the midpoint between corners of each side face of the semiconductor die. Further, the curved groove of a representative embodiment of the present invention is a more robust geometry than the groove created by a rectangular die seal, in that the curved groove is a sturdier structure due to the fact that it has no sharp corners.

It should also be noted that the "oval-like" shape of a die seal insert in accordance with a representative embodiment of the present invention provides greater support to remain secure in a pocket of a middle layer such as, for example, the middle layer 140 of FIG. 1. In contrast, a large rectangular insert may come out of such a pocket of a middle layer like middle layer 140, during the release of mold tool elements such as the upper chase 130 and the middle layer 140 of the exemplary mold tool 100 of FIG. 1.

Finite element analysis (FEA) results for a representative embodiment of the present invention have shown that die tensile stresses and shear stresses at the "die to mold" interface for a curved die are between those of a narrow groove case and a wide groove case for a rectangular die seal. Table 1, below, shows a comparison of the die tensile stress and the mold shear stress values at the "mold to die' interface.

TABLE 1

| Groove Shape | Groove Width (mm) Corner | Groove Width (mm) Middle | Die Tensile Stress (MPa) Max (middle) | Mold Shear Stress (MPa) Corner | Mold Shear Stress (MPa) Middle |
|---|---|---|---|---|---|
| Rectangular | 3.75 | 3.75 | 120 | 36 | 36 |
| Rectangular | 0.81 | 0.81 | 90 | 76 | 76 |
| Curved | 0.8 | 3 | 115 | 54 | 45 |

Additional analytical results using FEA for a rectangular die seal and a curved die seal are shown in Table 2, below. The data in row 1 of Table 2 relates to a rectangular die seal having a groove depth of 200 microns, an X-overhang of 3.4 millimeters, and a Y-overhang of 3.75 millimeters. Row 2 relates to a rectangular die seal having a groove depth of 200 microns, an X-overhang of 0.835 millimeters, and a Y-overhang of 0.81 millimeters. The data in row 3 of Table 2 relates to a curved die seal having a groove depth of 200 microns, an X-overhang varying between 0.8 millimeters nearest the corner of the die and 3 millimeters at the midpoint of the side of the die, and a Y-overhang varying between 0.8 millimeters nearest the corner of the die and 3 millimeters at the midpoint of the side of the die. The size of the semiconductor die modeled in the analysis was 19.2 millimeters in the X-dimension by 14.5 millimeters in the Y-dimension, with a die thickness of 787 µm.

TABLE 2

| Groove Depth (µ) | Groove Width (mm) | Tensile Stress (MPa) ΣXX | Tensile Stress (MPa) ΣYY | Shear Stress (MPa) ΣXZ | Shear Stress (MPa) ΣYZ |
|---|---|---|---|---|---|
| 200 | 3.4 × 3.75 | 100 | 120 | 40 (both) | 35 (both) |
| 200 | 0.835 × 0.81 | 80 | 90 | 75 (both) | 76 (both) |
| 200 | 0.8-3 × 0.8-3 | 95 | 115 | 54 (corner) | 56 (corner) |
| 200 | 0.8-3 × 0.8-3 | 95 | 115 | 45 (middle) | 43 (middle) |

A representative embodiment of the present invention permits the use of one insert size for a number of different die sizes, because any die seal designed in accordance with a representative embodiment of the present invention will cover the groove width limit of a reliable product, providing improved product reliability. Such a die seal, having been designed for a particular die size will, when used with die sizes smaller than the die size for which it was initially designed, result in a product having even larger groove widths and having better reliability than the packaged semiconductor devices produced when such a die seal is used with the die size for which the die seal was designed. A representative embodiment of the present invention when compared to a rectangular die seal provides a wider groove for better manufacturability, a more robust groove geometry for improved reliability, and may meet current package specifications such as, for example, those for co-planarity.

In addition, current molding plates designed for narrow groove widths may be easily modified to use a curved die seal in accordance with a representative embodiment of the present invention that produces a wider groove, without modifying the molding gate. This may represent a significant cost savings, as the only change that may be involved is to the pocket of the element of the mold tool, into which the seal is inserted.

Figure 24:
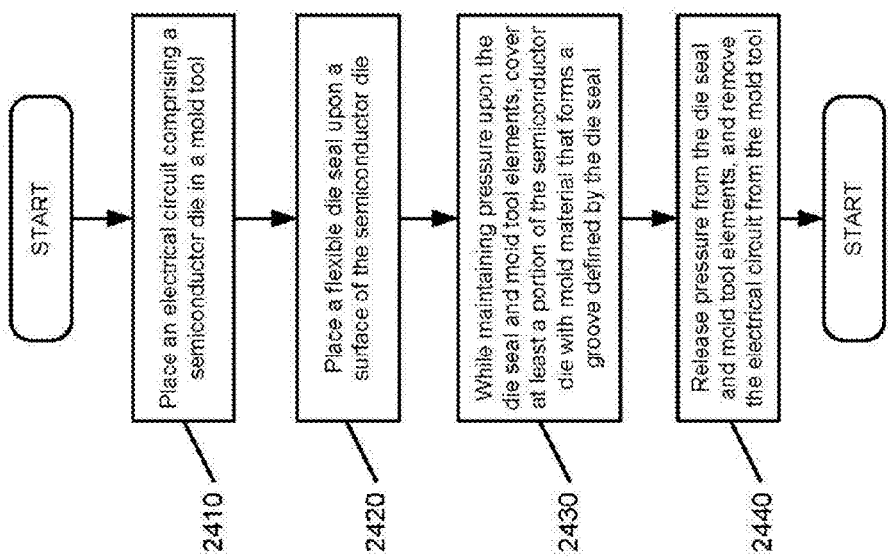
FIG. 24 is a flowchart illustrating an exemplary method of applying mold material to a semiconductor die of an electrical circuit, in accordance with a representative embodiment of the present invention.

FIG. 24 is a flowchart illustrating an exemplary method of applying mold material to a semiconductor die of an electrical circuit, in accordance with a representative embodiment of the present invention. As shown in FIG. 24, the method begins at block 2410, where an electrical circuit comprising a semiconductor die is placed in a mold tool such as, for example, the mold tool 100 described above with respect to FIG. 1, which may be assembled to use a die seal such as, for example, any of those described above with respect to FIGS. 7-23. It should be noted that although mention is made here, and the illustrations of some of the figures relate to placing what is shown as a single electrical circuit in a single mold tool, such a mold tool may, in fact, have a number of mold cavities, where each mold cavity is capable of being used for the application of mold material to a separate electrical circuit in the manner described herein, without departing from the spirit and scope of the present invention.

Next, at block 2420, the method of FIG. 24 places a flexible die seal in accordance with a representative embodiment of the present invention upon a surface of the semiconductor die of the electrical circuit. The die seal used may be, for example, any of those described above with respect to FIGS. 7-23. Then, at block 2430, the method of FIG. 24, while maintaining pressure upon the die seal and mold tool elements, covers at least a portion of the semiconductor die of the electrical circuit with mold material that forms a groove defined by the die seal. The groove in the mold material formed in this manner may, for example, take any of the shapes described above with respect to FIGS. 7-23, but is not so limited, as FIGS. 7-23 are offered as merely illustrative of examples of representative embodiments of the present invention. Next, at block 2440, the method of FIG. 24 may release pressure from the die seal and mold tool elements, and the electrical circuit may be removed from the mold tool. It should be noted that although the flowchart of FIG. 24 illustrates a single pass that produces a single electrical circuit, it will be recognized that the method may be repeated, as needed, to produce whatever quantity is desired.

Aspects of the present invention may be seen in an integrated circuit produced by the process illustrated in FIG. 24 and discussed above. For example, the integrated circuit may comprise features (e.g., mold grooves) formed by utilization of any of the die seal characteristics discussed herein.

Aspects of the present invention may be seen in a seal for protecting a semiconductor die from contact with a mold material during encapsulation. The semiconductor die may comprise a first die surface, a second die surface generally parallel to the first die surface, and a plurality of faces, and each face may connect an edge of the first die surface with a corresponding edge of the second die surface to define a die thickness. Such a seal may comprise a generally planar first seal surface comprising a first area for covering the first die surface, and the first area may have a plurality of edges, each edge of the first area having a corresponding edge of the first die surface. Such a seal may comprise a second area surrounding the first area, the second area comprising a plurality of elongated protrusions having a length oriented parallel to the first seal surface and to a corresponding edge of the first area. Each protrusion may have a generally flat portion for covering a portion of one of the plurality of faces. A seal in accordance with a representative embodiment may also comprise a second seal surface generally parallel to the first seal surface, where the second seal surface may be connected to the first seal surface, and where the seal comprises a deformable material.

In a representative embodiment of the present invention, the first die surface may be rectangular, and the flat portion may run parallel to the length of the protrusion and may face the center of the first area at the midpoint of the length. The protrusion may maximally project from the first seal surface at the midpoint of the length of the protrusion, and the projection of each protrusion from the plane of the first seal surface may increase from either end of the protrusion to the midpoint of the length of the protrusion. In various representative embodiments, the maximum projection of each protrusion may be at least 50% of the die thickness, the length of each protrusion may be less than a length of the corresponding edge of the first area, and the protrusion may comprise a flap. The deformable material may comprise a silicon rubber, and the deformable material may have a hardness in the range of about durometer 30 to about durometer 50.

Further aspects of the present invention may be found in a seal for protecting a semiconductor die from contact with a mold material during encapsulation. The semiconductor die may comprise a first die surface, a second die surface generally parallel to the first die surface, and a plurality of faces, each face connecting an edge of the first die surface with a corresponding edge of the second die surface to define a die thickness. Such a seal may comprise a first seal surface comprising an area for covering the first die surface, where the area may be bounded by a plurality of elongated protrusions each having a length oriented parallel to the first seal surface each protrusion and having a generally flat portion for covering a portion of one of the plurality of faces. Each protrusion may maximally project from the first seal surface at a midpoint of the length of the protrusion. Such a seal may also comprise a second seal surface generally parallel to the first seal surface, where the second seal surface may be connected to the first seal surface, and where the seal comprises a deformable material. The first die surface may be rectangular, each flat portion may run parallel to the length of the protrusion, and at the midpoint of the length of the protrusion may face the center of the bounded area.

In a representative embodiment of the present invention, each protrusion may project from the plane of the first seal surface a first amount proximate either end of the length of the protrusion, and may project from the plane of the first seal surface a second amount greater than the first amount proximate the midpoint of the length of the protrusion. A maximum projection of each protrusion may be at least 50% of the die thickness.

Additional aspects of the present invention may be observed in a seal for protecting a semiconductor die from contact with a mold material during encapsulation in a mold tool. The semiconductor die may comprise a first die surface, a second die surface generally parallel to the first die surface, and a plurality of faces. Each face may connect an edge of the first die surface with a corresponding edge of the second die surface to define a die thickness. Such a seal may comprise a generally planar first seal surface comprising an area for covering the first die surface, and a second seal surface for mating with an interior portion of the mold tool, where the second seal surface may be generally parallel to the first seal surface. Such a seal may also comprise a curved seal wall connecting the first seal surface to the second seal surface; and the seal may comprise a deformable material. The outline of the first seal surface may be oval, and the minimum radius of curvature of the seal wall in the plane of the first seal surface may be in the range of about 1.5 millimeters to about 12 millimeters. The deformable material may be a silicon rubber, and the deformable material may comprise a material having a hardness in the range of about durometer 30 to about durometer 50.

Aspects of the present invention may also be seen in an electrical circuit comprising a semiconductor die and mold material that covers at least a portion of the semiconductor die. The mold material may comprise a groove formed by a die seal during application of the mold material to the electrical circuit. Such a seal may comprise a generally planar first seal surface comprising a first area for covering a first die surface, where the first area may have a plurality of edges, and each edge of the first area may have a corresponding edge of the first die surface. The first seal surface may also comprise a second area surrounding the first area, and the second area may comprise a plurality of elongated protrusions having a length oriented parallel to the first seal surface and to a corresponding edge of the first area. Each protrusion may have a generally flat portion for covering a portion of one of a plurality of faces of the semiconductor die. The seal may also comprise a second seal surface for mating with a mold tool, and the seal may comprise a deformable material.

Additional aspects of the present invention may be found in an electrical circuit comprising a semiconductor die and mold material that covers at least a portion of the semiconductor die. The mold material may comprise a groove formed by a die seal during application of the mold material to the electrical circuit. Such a seal may comprise a first seal surface comprising an area for covering a first die surface, in which the area may be bounded by a plurality of elongated protrusions each having a length oriented parallel to the first seal surface, a generally flat portion for covering a portion of one of a plurality of faces of the semiconductor die, and maximally projecting from the first seal surface at a midpoint of the length of the protrusion. A representative embodiment of the present invention may also comprise a second seal surface for mating with a mold tool, and the seal may comprise a deformable material.

Other aspects of the present invention may be observed in an electrical circuit comprising a semiconductor die and mold material that covers at least a portion of the semiconductor die. The mold material may comprise a groove formed by a die seal during application of the mold material to the electrical circuit. Such a seal may comprise a generally planar first seal surface comprising an area for covering a first surface of the semiconductor die and a second seal surface for mating with a mold tool. The second seal surface may be generally parallel to the first seal surface. The seal may also comprise a curved seal wall connecting the first seal surface to the second seal surface, and the seal may comprise a deformable material.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for producing an electrical circuit, the method comprising:
   placing a semiconductor die in a mold tool, the semiconductor die comprising a first die surface, a second die surface generally parallel to the first die surface, and a plurality of die faces, each die face connecting an edge of the first die surface with a corresponding edge of the second die surface to define a die thickness;
   placing a flexible die seal upon the first die surface of the semiconductor die; and
   while pressing the die seal against the semiconductor die, applying mold material to at least a portion of the semiconductor die,
   wherein the die seal comprises a generally planar first seal surface comprising:
      a first area for covering the first die surface during said applying mold material, the first area having a plurality of edges, each edge of the first area corresponding to a corresponding edge of the first die surface; and
      a second area surrounding the first area, the second area comprising a plurality of elongated protrusions having a length oriented parallel to the first seal surface and to a corresponding edge of the first area, each protrusion having a generally flat portion for covering a portion of a corresponding one of the plurality of die faces during said applying mold material, wherein each protrusion of the plurality of elongated protrusions comprises a flap, and wherein a lower edge of the flap has a contour that controls an amount of its corresponding one of the plurality of die faces that is exposed to contact with the mold material used to encapsulate the semiconductor die.

2. The method of claim 1, wherein the first die surface is rectangular.

3. The method of claim 1, wherein the flat portion runs parallel to the length of the protrusion, and faces the center of the first area at the midpoint of the length.

4. The method of claim 1, wherein at least one of the protrusions maximally projects from the first seal surface at the midpoint of the length of the protrusion.

5. The method of claim 1, wherein the projection of each protrusion from a plane of the first seal surface increases from either end of the protrusion to the midpoint of the length of the protrusion.

6. The method of claim 4, wherein the maximum projection of each protrusion is at least 50% of the die thickness.

7. The method of claim 1, wherein the length of each protrusion is less than a length of the corresponding edge of the first area.

8. The method of claim 1, wherein each protrusion comprises a flap.

9. The method of claim 1, wherein the flexible die seal comprises a silicon rubber.

10. The method of claim 1, wherein the flexible die seal comprises a material that has a hardness in the range of about durometer 30 to about durometer 50.

11. A method for producing an electrical circuit, the method comprising:
    placing a semiconductor die in a mold tool, the semiconductor die comprising a first die surface, a second die surface generally parallel to the first die surface, and a plurality of die faces, each die face connecting an edge of the first die surface with a corresponding edge of the second die surface to define a die thickness;
    placing a flexible die seal upon the first die surface of the semiconductor die; and
    while pressing the die seal against the semiconductor die, applying mold material to at least a portion of the semiconductor die,
    wherein the die seal comprises a generally planar first seal surface comprising:
       an area for covering the first die surface during said applying mold material; and
       a plurality of elongated protrusions generally bounding the area, each having a length oriented parallel to the first seal surface and a generally flat portion for covering a portion of a corresponding one of the plurality of die faces during said applying mold material, wherein each protrusion of plurality of elongated protrusions comprises a flap, wherein a lower edge of the flap has a contour that controls an amount of its corresponding one of the plurality of die faces that is exposed to contact with the mold material used to encapsulate the semiconductor die, and wherein each protrusion maximally projects from the first seal surface at a midpoint of the length of the protrusion.

12. The method of claim 11, wherein the first die surface is rectangular.

13. The method of claim 11, wherein each flat portion runs parallel to the length of the protrusion, and at the midpoint of the length of the protrusion faces the center of the area.

14. The method of claim 11, wherein each protrusion projects from a plane of the first seal surface a first amount proximate either end of the length of the protrusion, and projects from the plane of the first seal surface a second amount greater than the first amount proximate the midpoint of the length of the protrusion.

15. The method of claim 11, wherein a maximum projection of each protrusion is at least 50% of the die thickness.

16. A method for producing an electrical circuit, the method comprising:
  placing a semiconductor die in a mold tool, the semiconductor die comprising a first die surface, a second die surface generally parallel to the first die surface, and a plurality of die faces, each die face connecting an edge of the first die surface with a corresponding edge of the second die surface to define a die thickness;
  placing a flexible die seal upon the first die surface of the semiconductor die; and
  while pressing the die seal against the semiconductor die, applying mold material to at least a portion of the semiconductor die,
  wherein the die seal comprises:
    a generally planar first seal surface comprising an area for covering the first die surface; and
    a curved seal wall connecting the first seal surface to a second seal surface,
      wherein an outline of the first seal surface in a planar view comprises a plurality of curves.

17. The method of claim 16, wherein the outline of the first seal surface is oval.

18. The method of claim 16, wherein the minimum radius of curvature of the seal wall in a plane of the first seal surface is in the range of about 1.5 millimeters to about 12 millimeters.

19. The method of claim 16, wherein the flexible die seal comprises a silicon rubber.

20. The method of claim 16, wherein the flexible die seal comprises a material that has a hardness in the range of about durometer 30 to about durometer 50.

21. A method for producing an electrical circuit, the method comprising:
  placing a semiconductor die in a mold tool, the semiconductor die comprising a first die surface, a second die surface generally parallel to the first die surface, and a plurality of die faces, each die face connecting an edge of the first die surface with a corresponding edge of the second die surface to define a die thickness;
  placing a flexible die seal upon the first die surface of the semiconductor die; and
  while pressing the die seal against the semiconductor die, applying mold material to at least a portion of the semiconductor die,
  wherein the die seal comprises a generally planar first seal surface comprising:
    a first area for covering the first die surface during said applying mold material, the first area having a plurality of edges, each edge of the first area corresponding to a corresponding edge of the first die surface; and
    a second area surrounding the first area, the second area comprising a plurality of elongated protrusions having a length oriented parallel to the first seal surface and to a corresponding edge of the first area, each protrusion having a generally flat portion for covering a portion of a corresponding one of the plurality of die faces during said applying mold material, wherein each protrusion of the plurality of elongated protrusions comprises a flap, wherein a lower edge of the flap has a contour that controls an amount of its corresponding one of the plurality of die faces that is exposed to contact with the mold material used to encapsulate the semiconductor die, and wherein the maximum projection of each protrusion is at least 50% of the die thickness at a midpoint of the length of the protrusion.

22. A method for producing an electrical circuit, the method comprising:
  placing a semiconductor die in a mold tool, the semiconductor die comprising a first die surface, a second die surface generally parallel to the first die surface, and a plurality of die faces, each die face connecting an edge of the first die surface with a corresponding edge of the second die surface to define a die thickness;
  placing a flexible die seal upon the first die surface of the semiconductor die; and
  while pressing the die seal against the semiconductor die, applying mold material to at least a portion of the semiconductor die,
  wherein the die seal comprises a generally planar first seal surface comprising:
    an area for covering the first die surface during said applying mold material; and
    a plurality of elongated protrusions generally bounding the area, each having a length oriented parallel to the first seal surface and a generally flat portion for covering a portion of a corresponding one of the plurality of die faces during said applying mold material, wherein each protrusion of the plurality of elongated protrusions comprises a flap, wherein a lower edge of the flap has a contour that controls an amount of its corresponding one of the plurality of die faces that is exposed to contact with the mold material used to encapsulate the semiconductor die and maximally projects from the first seal surface at a midpoint of the length of the protrusion, and wherein the length of each protrusion is less than a length of a corresponding one of the plurality of die faces.

23. A method for producing an electrical circuit, the method comprising:
  placing a semiconductor die in a mold tool, the semiconductor die comprising a first die surface, a second die surface generally parallel to the first die surface, and a plurality of die faces, each die face connecting an edge of the first die surface with a corresponding edge of the second die surface to define a die thickness;
  placing a flexible die seal upon the first die surface of the semiconductor die; and
  while pressing the die seal against the semiconductor die, applying mold material to at least a portion of the semiconductor die, wherein the die seal comprises:
- a generally planar first seal surface comprising an area for covering the first die surface; and
- wherein an outline of the seal surface in a planar view is curved, proximate a portion of an area corresponding to a corner of the first die surface.

\* \* \* \* \*